United States Patent [19]
Wells et al.

[11] Patent Number: 5,437,020
[45] Date of Patent: Jul. 25, 1995

[54] METHOD AND CIRCUITRY FOR DETECTING LOST SECTORS OF DATA IN A SOLID STATE MEMORY DISK

[75] Inventors: Steven Wells, Citrus Heights; Robert N. Hasbun, Shingle Springs; Richard P. Garner, Cameron Park, all of Calif.

[73] Assignee: Intel Corporation, Santa Clara, Calif.

[21] Appl. No.: 969,723

[22] Filed: Oct. 3, 1992

[51] Int. Cl.⁶ ............................................. G06F 13/10
[52] U.S. Cl. .................................................. 395/425
[58] Field of Search ................................ 395/400, 425

*Primary Examiner*—David L. Robertson
*Attorney, Agent, or Firm*—Blakely, Sokoloff, Taylor & Zafman

[57] ABSTRACT

A method of detecting the loss of a sector of data stored in a solid state memory disk is described. Detection is enabled by the creation of a header for each sector number during formatting. Each header includes a logical sector number equal to a sector number. Location and loss of a sector of data associated with a particular sector number is aided by a sector header translation table. The sector header translation table stores an offset, or pointer, for each sector number that points to its associated header. The method by which the sector header translation table is generated aids in the detection of lost sectors of data. Upon power-up, each offset in the sector header translation table is initialized to an initial, invalid value. Afterward, the nonvolatile semiconductor memory is scanned and the sector header translation table is modified so that for each sector number it points to the header including a logical sector number equal to the sector number. As a result, retrieving an invalid offset from the sector header translation table indicates that the sector of data associated with the sector number is lost.

Circuitry for detecting the loss of sector data stored in a solid state memory disk is also described.

23 Claims, 5 Drawing Sheets

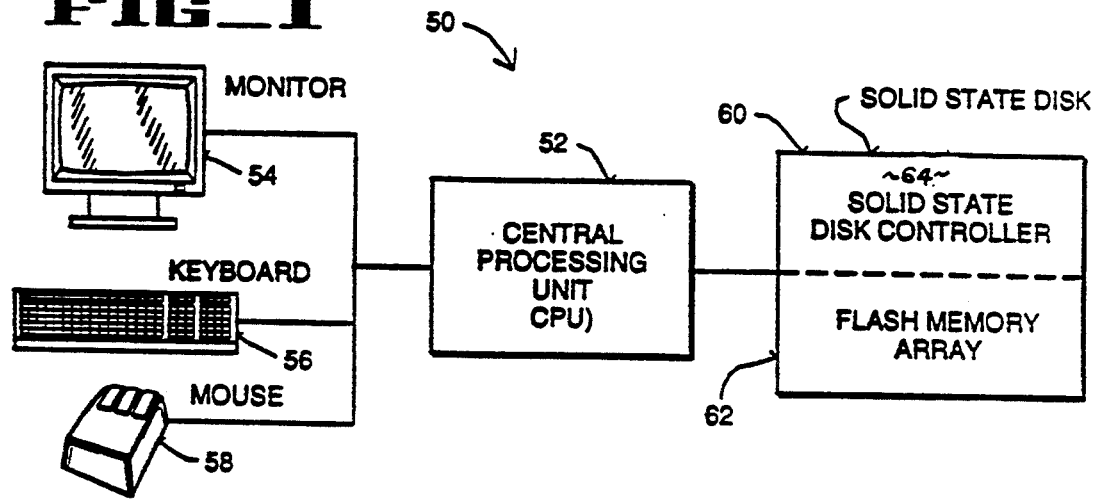
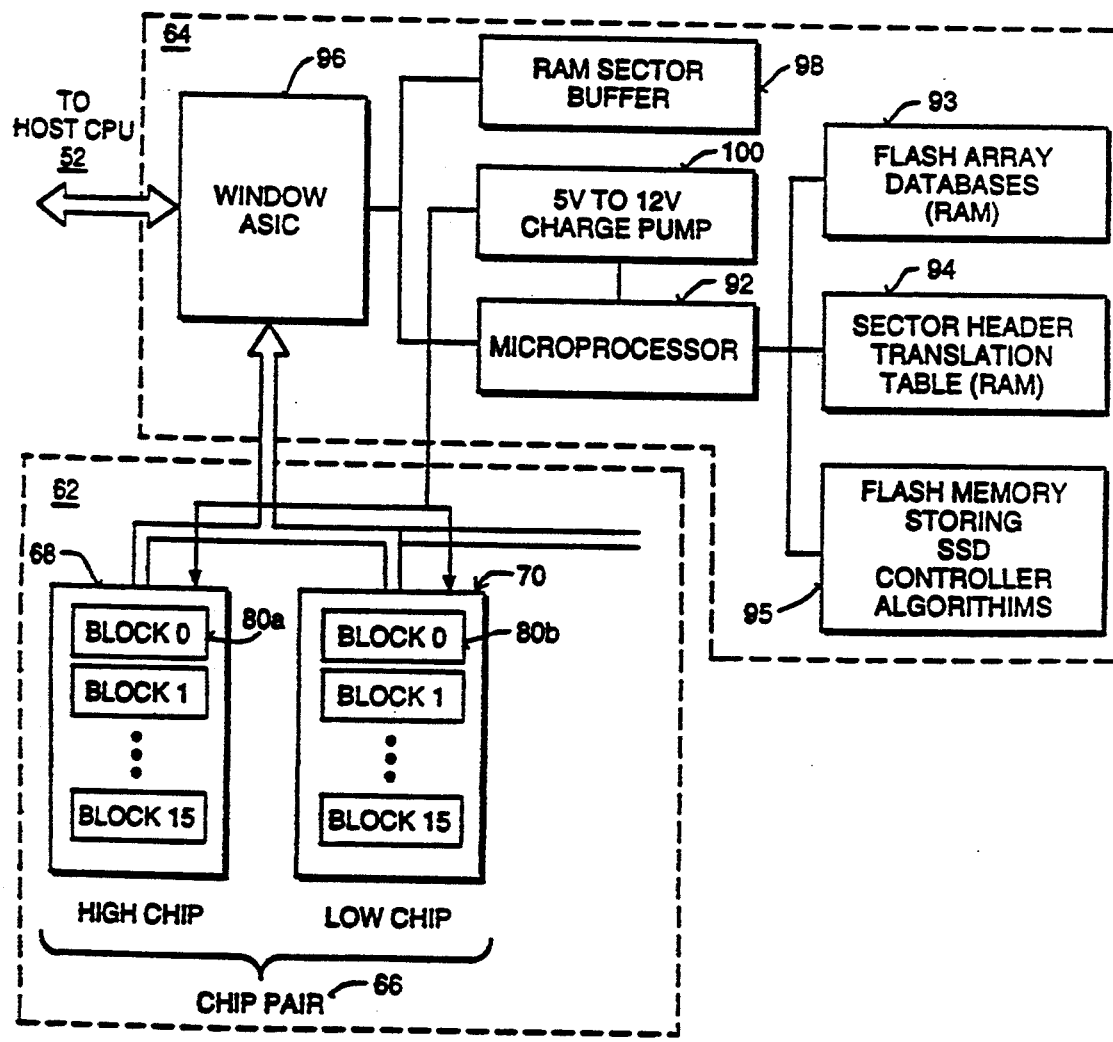

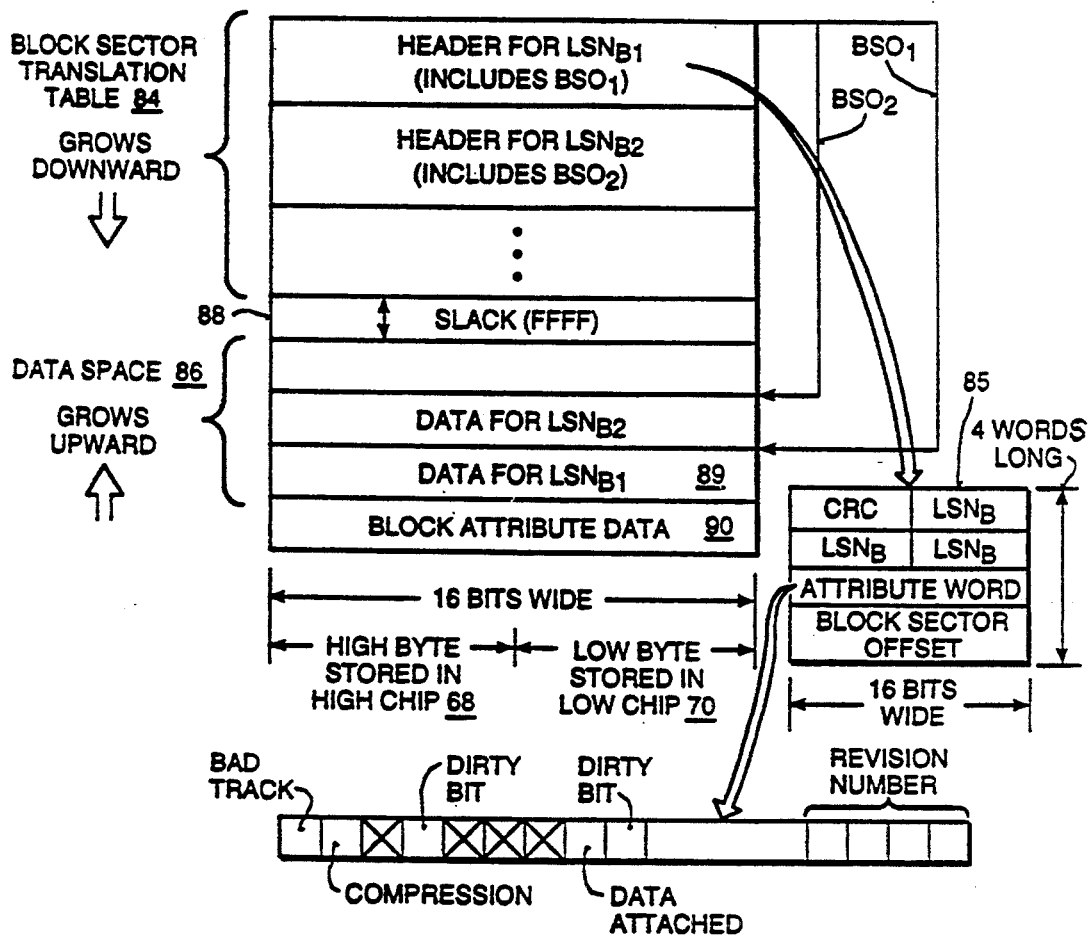
FIG_3
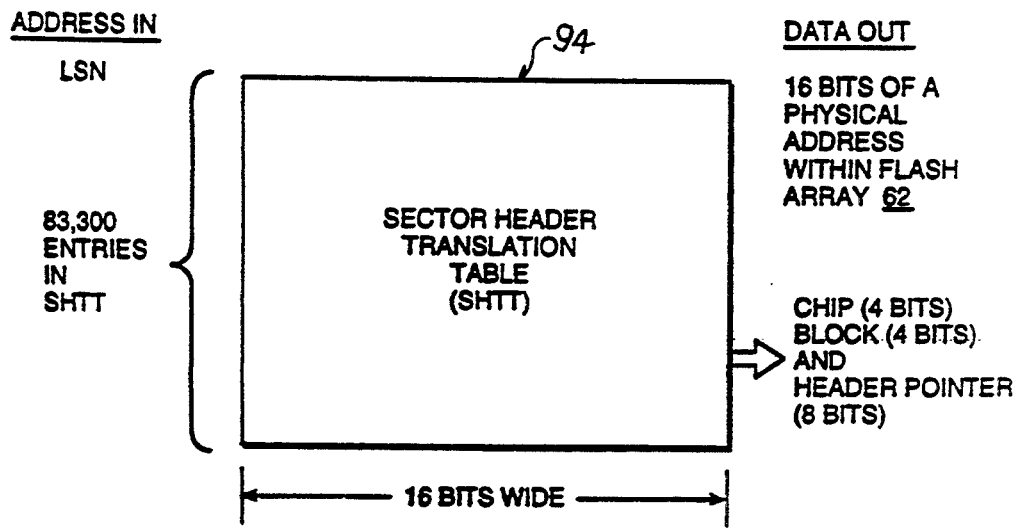
FIG_4

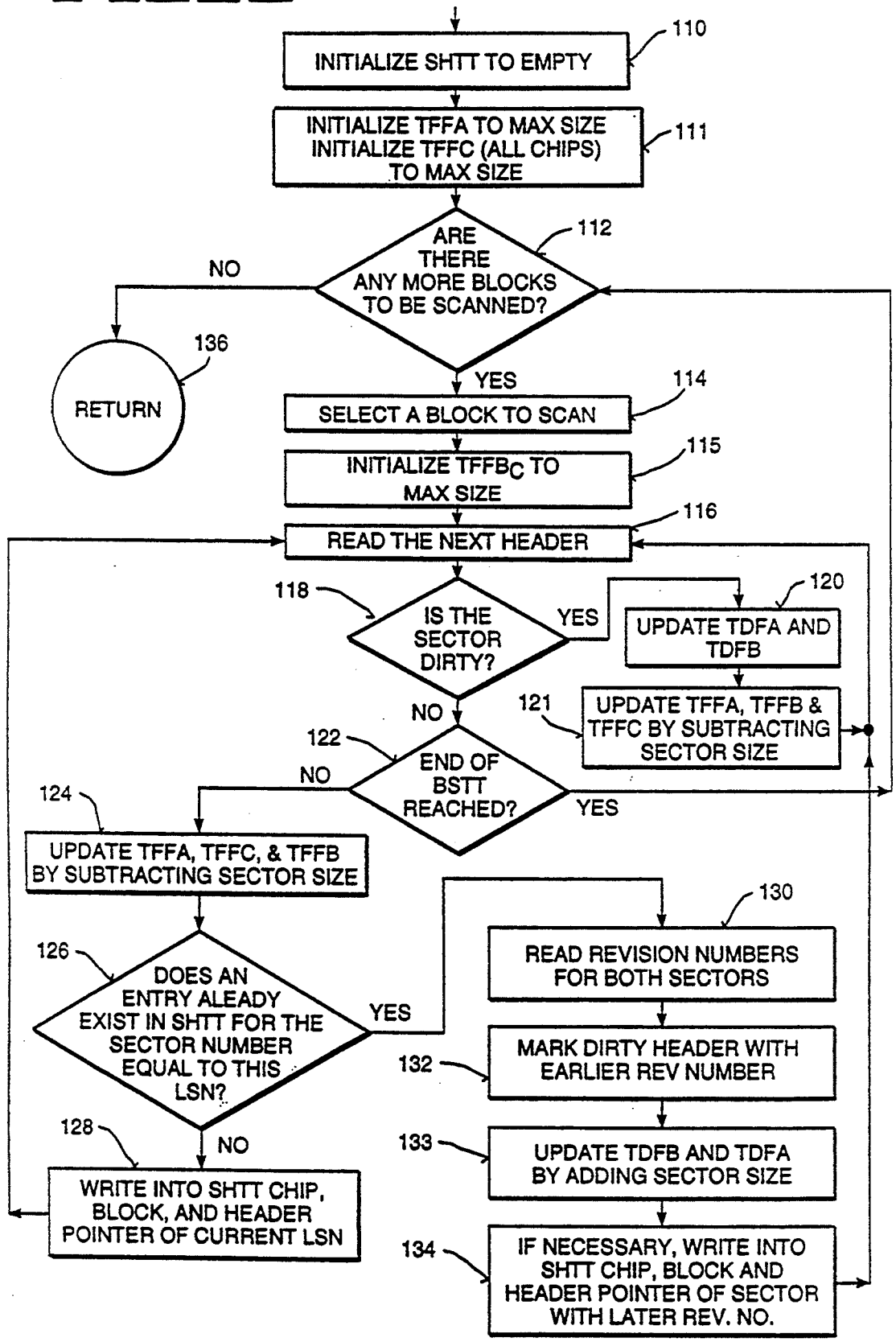

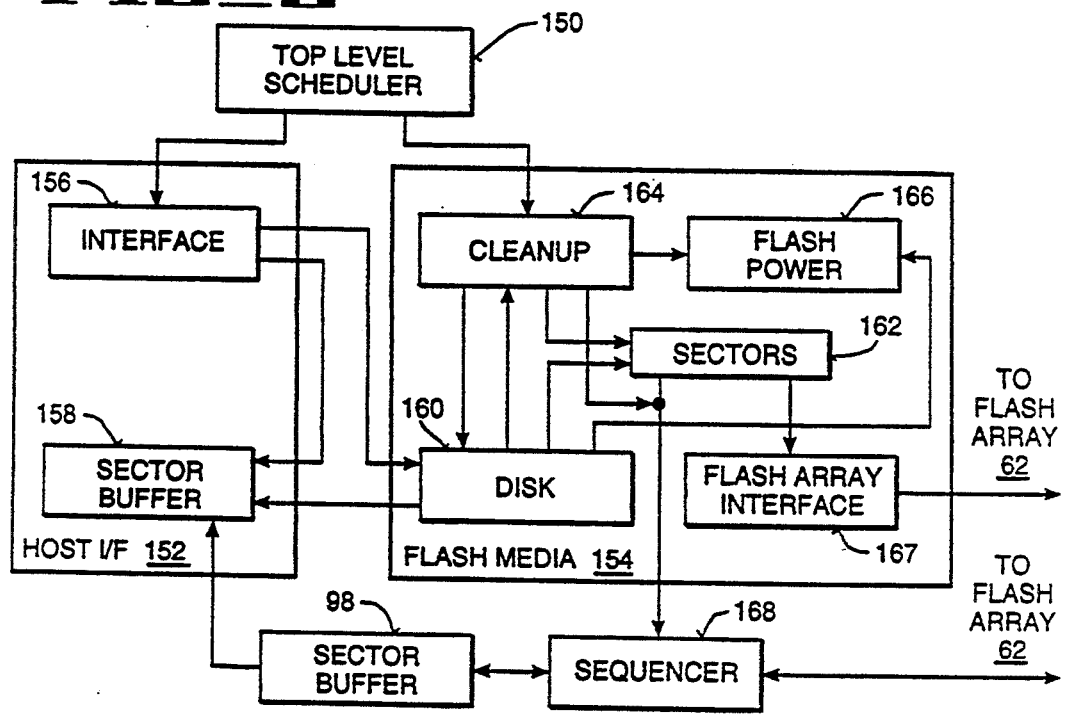
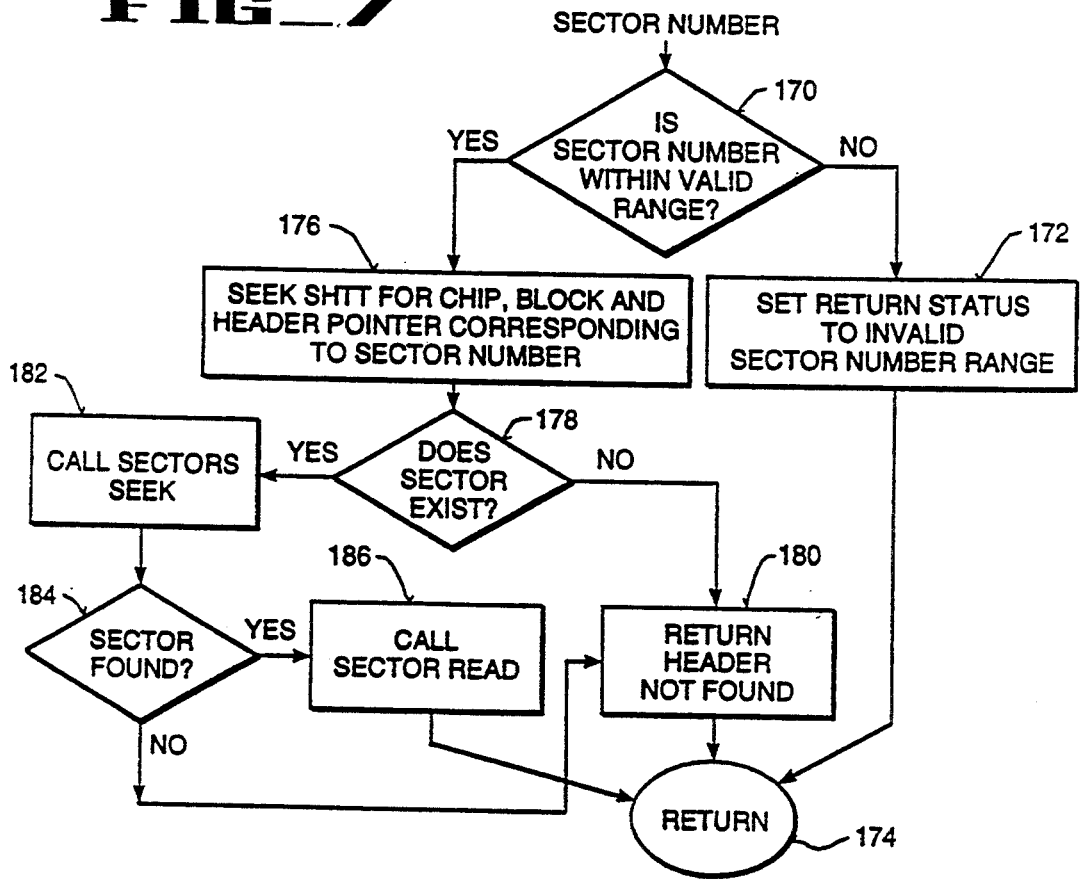

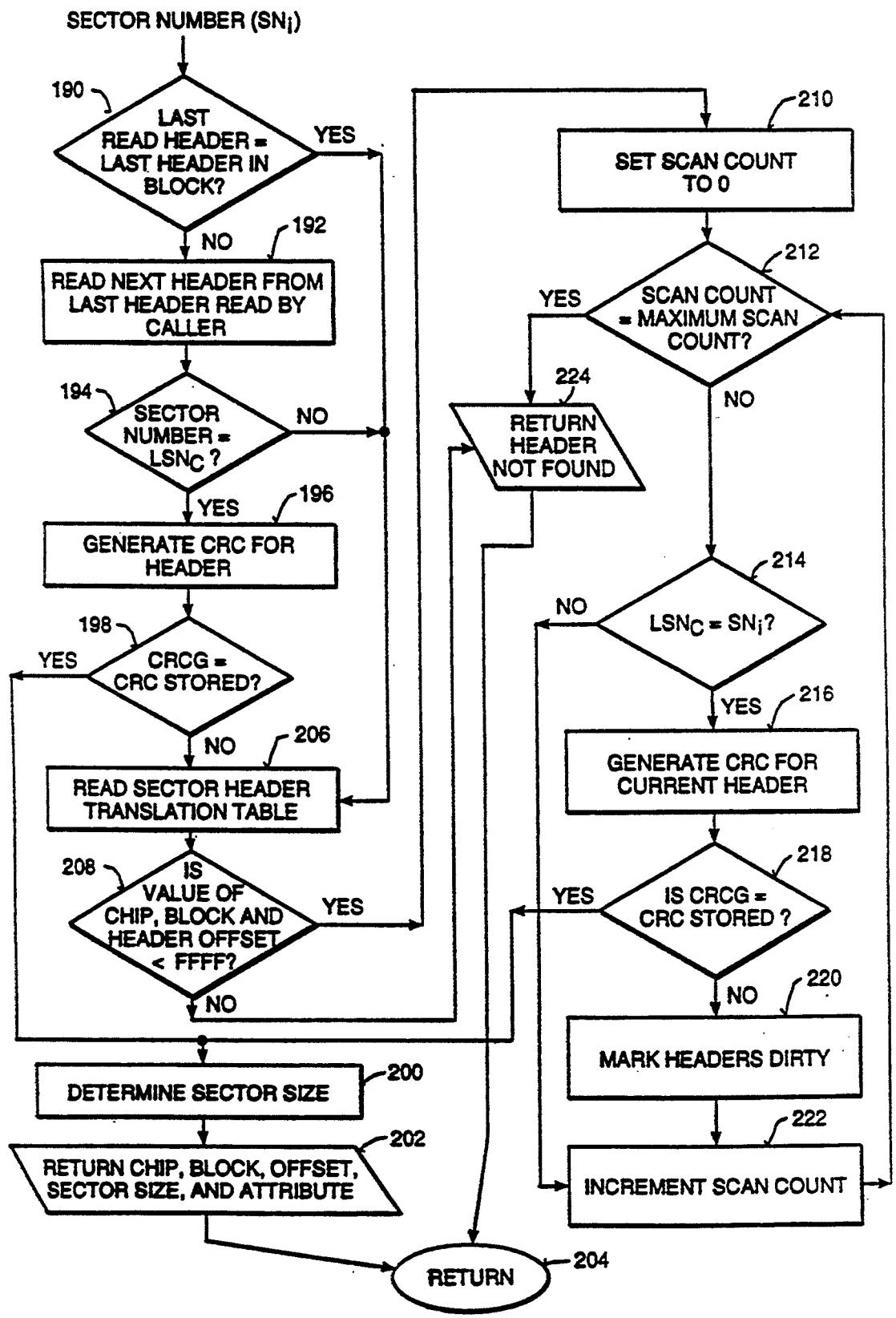
FIG_8

METHOD AND CIRCUITRY FOR DETECTING LOST SECTORS OF DATA IN A SOLID STATE MEMORY DISK

FIELD OF THE INVENTION

The present invention relates to a solid state memory disk. More particularly the present invention relates to a method and circuitry for detecting the loss of sectors of data stored within a solid state memory disk.

BACKGROUND OF THE INVENTION

Most prior personal computers include many types of memory storage devices. Hard magnetic disk drives are used for mass memory storage, while different types of semiconductor memories are used for other purposes.

The non-volatility of hard magnetic disk drives is one of the chief reasons for their use. They may be turned on and off without loss of data. Hard drives store data on concentric tracks. Each track includes several sectors, each of which is typically 512 bytes in length. Reads and writes to magnetic disk drives occur a sector at a time.

A typical user file stored on a magnetic disk drive occupies many sectors, randomly located on the surface of the disk drive. A file allocation table (FAT) allows location of each sector of the file by storing a chain of pointers for the file. Each pointer points to the next sector of the file.

Hard drives suffer from a number of disadvantages. Their size, their height in particular, often makes them unattractive for use in portable and lap top computers. The height of a hard disk drive has often been the limiting factor in attempts to reduce computer size to make computers more portable. Hard drives also consume relatively large amounts of power, which makes them even less attractive for computers that are battery powered.

Hard drives are less than ideal for use in computers that will used out-of-doors. Magnetic disk drives are extremely sensitive to vibration and shock. Additionally, magnetic drives cannot tolerate the dust and humidity of associated with much of the great outdoors.

Semiconductor memories, also referred to as solid state memories, do not suffer from many of the disadvantages of magnetic disk drives. They are small and rugged and consume less power than magnetic drives.

One type of non-volatile semiconductor memory is the FLASH electrically erasable programmable read only memory (FLASH memory). FLASH memories can be programmed by the user and once programmed retain their data until erased. FLASH memories are rapidly erased by erasing a block of memory at a time. A block is a relatively large amount of data, approximately 64 Kbytes or 65,535 bytes.

A FLASH memory cell is erased when net charge is neutral. An erased FLASH bit is referred to as a logical 1. Conversely, a FLASH memory cell is programmed when the net charge is negative. A FLASH memory cell cannot be reprogrammed without a prior erasure with one exception. Any FLASH bit can be programmed to a 0 without prior erasure.

In some prior FLASH memories programming and erasure is controlled internally by a write state machine or a command register. Internal control of programming and erasure lessens the knowledge and time required to program and erase the FLASH memories. FLASH erase time times remain relatively slow despite internal control. Erase cycle time is on the order one to two seconds. If an erase must occur before every write then it is not possible to approach magnetic disk drive write times using FLASH memory.

SUMMARY OF THE INVENTION

A method of detecting the loss of a sector of data stored in a solid state memory disk is described. The solid state memory disk stores many sectors of data using nonvolatile semiconductor memory devices. Detection is enabled by the creation of a header for each sector number during formatting. Each header includes a logical sector number equal to the sector number with which the data is associated. Ultimately, each header will point to the physical location of the sector of data associated with the sector number. However, at the time of formatting, sector data does not yet exist and the header reflects this using a data attached bit. During formatting the data attached bit is set appropriately to indicate that no data is attached.

Location and loss of a sector of data associated with a particular sector number is aided by a sector header translation table. The sector header translation table stores an offset, or pointer, for each sector number. A valid offset points to a physical location near the header associated with the sector number. The header in turn points to the physical location of the sector of data associated with the same sector number. An invalid offset indicates that the sector of data associated with the sector number is lost.

The sector header translation table is stored in a volatile memory and, consequently, must be rebuilt each time the solid state memory disk is powered-up. The sector header translation table aids in the detection of lost sectors of data. Upon power-up, each offset in the sector header translation table is initialized to an initial, invalid value. Afterward, the nonvolatile semiconductor memories are scanned to identify logical sector numbers stored within headers. When a logical sector number equal to a sector number is located the sector number's pointer offset within the sector header translation table is modified. As a result, retrieving an invalid offset from the sector header translation table indicates that the sector of data associated with the sector number is lost.

This is not the sole means of determining the loss of a sector of data associated with a particular sector number. A sector of data can be lost even if the sector header translation table includes a valid offset. In this case, the loss may be detected in one of two ways. First, it may not be possible to locate a header in the vicinity of the offset that includes a logical sector number equal to the sector number being sought. Second, even if a header is located that includes the desired logical sector number a CRC check may indicate that the header has been corrupted. In this situation, the sector of data associated with the sector number is considered lost.

Other objects, features, and advantages of the present invention will be apparent from the accompanying drawings and the detailed description that follows.

BRIEF DESCRIPTION OF THE FIGURES

The present invention is illustrated by way of example and not limitation in the figures of the accompanying drawings in which references indicate similar elements and in which:

FIG. 1 is a block diagram of a personal computer including a solid state memory disk, FIG. 2 is a block diagram of a solid state memory disk, FIG. 3 is a block diagram of a block file structure, FIG. 4 is a block diagram of a first embodiment of the sector header translation table.

FIG. 5 is a flow diagram of an algorithm for building a sector header translation table upon power-up.

FIG. 6 is an object diagram of the algorithms of the solid state disk controller.

FIG. 7 is a flow diagram for a disk read,

FIG. 8 is a flow diagram for seeking a sector of data using a block sector translation table.

DETAILED DESCRIPTION

I. Overview of Solid State Disk

FIG. 1 illustrates in block diagram form personal computer 50. Personal computer 50 includes central processing unit (CPU) 52 and monitor 54 for visually displaying information to a computer user. Keyboard 56 allows the computer user to input data to CPU 52. By moving mouse 58 the computer user moves a pointer displayed on monitor 54. Personal computer 50 uses solid state memory disk 60 for mass memory storage, rather than a hard magnetic disk. Solid state disk 60 includes a solid state disk controller to control nonvolatile memory array 62. Nonvolatile semiconductor memory array 62 is also referred to as FLASH array 62.

Sectors of data stored within FLASH array 62 may be lost due to data corruption or failure of the media within a memory device. Consequently, the present invention includes method and circuitry for detecting the loss of sector data. To differentiate the loss of a sector of data from the lack of data for a sector number, a header is created for each sector number during formatting. The header includes a data attached bit that indicates whether a sector of data is attached to the sector number. Given that a header is created for each sector number, the sector of data is lost if the header cannot be located in response to a read or write command.

A. FLASH Array and Block File Structure

A greater understanding of solid state disk controller 64 is aided by an understanding of the object of its control, FLASH array 62. The program and erase characteristics of FLASH array 62 strongly influence solid state disk controller 64. The FLASH devices within FLASH array 62 must be erased a block at a time, but can be programmed a byte at a time. Once programmed to a 0, a bit of FLASH memory cannot be programmed to a 1 without first erasing an entire block. Erased bytes of memory are referred to as "free" because they are ready to be written.

Erasure of FLASH memory is a slow process. Performing an erase each time a sector of data is written is impractical. Writes would be slow and power consumption inefficient because an entire block pair, 128 Kbytes, would have to be erased just to write one sector, 512 bytes. To allow rapid sector writes, solid state disk controller 64 writes each sector of data to a new, free location each time a sector is written. A result of this write method is that there may be several versions of the sector data associated with a single sector number. The most recent version of the sector data is referred to as a "good sector," "valid sector" or a "user sector." In contrast, the earlier version of the sector is invalid and will be marked as "dirty."

The actual amount of FLASH memory within FLASH array 62 cannot greatly exceed the amount stated as available to the user because FLASH memory is relatively expensive. Stated another way, when the amount of reserve memory within FLASH array 62 is lean dirty sectors must be converted into free memory to ensure the availability of memory for writes.

FIG. 2 illustrates in block diagram form FLASH array 62 and solid state disk controller 64. In one embodiment, FLASH array 62 uses thirty 1 megabyte, by 8, FLASH memory chips. These FLASH memories include a write state machine for automatically controlling erasure and programming. These thirty FLASH memory devices function as a 40 megabyte memory disk when data compression is used. Each FLASH chip inputs and outputs data 8 bits at a time. To permit word-wide input and output, FLASH array 62 is organized as pairs of FLASH devices, only one chip pair 66 of which is shown. High chip 68 of chip pair 66 stores the high byte of a word, while low chip 70 stores the lower byte of a word. Solid state disk controller 64 is thus able to treat each chip pair as a single 16 bit-wide memory device. Word-wide input and output gives solid state drive 60 a speed advantage compared to magnetic drives, which use serial bit stream I/O.

Each chip pair is organized as 16 blocks, each including 128 Kbytes of memory. Because each block of memory can store many sectors of data, each block includes, as illustrated in FIG. 3, a block sector translation table (BSTT) 84 to identify and locate each sector of data.

FIG. 3 illustrates block 80 and the file structure used by it and all other blocks. Block 80 is represented as a single word wide structure but is actually stored in two FLASH chips. The high byte of each word is stored in high chip 68 and the low byte of each word is stored in low chip 70.

The data structure of block 80 includes block sector translation table 84 and data space 86. Block sector translation table 84 stores headers. A header is a block of information about one logical sector number and its associated data. As used herein a logical sector number (LSN) refers to a sector number stored within a BSTT. A sector number is a sector identifier received from CPU 52, which the CPU believes corresponds to a fixed physical location. However, as a result of the write policy used by solid state disk 60, an LSN does not correspond to a fixed physical location. Also as a result of the write policy used, several headers and LSNs may correspond to a single sector number.

In one embodiment, each logical sector number is 24 bits long.

A header is created for each and every sector number during disk formatting. This allows the loss of sectors of data to be detected during the execution of read and write commands. Failure to find the header associated with a particular sector number indicates that the associated sector of data has been lost. As used herein "lost" refers to a sector of data that disappears because of a defect in FLASH 62 array or to a sector of data that is unreliable because it has been corrupted.

Each header 85 includes a cyclical redundancy check (CRC), which allows solid state disk 60 to determine the reliability of header 85.

Header 85 also includes an attribute word that contains a great deal of information about the sector data associated with the header. One bit of the attribute word indicates whether the sector number has been marked as part of a bad track. Another bit indicates whether or not the sector data has been compressed. The attribute word includes two dirty bits for reliability. The sector data associated with the header is considered valid if both dirty bits are set and dirty if either dirty bit is reset. The attribute word also includes a data attached bit. When no sector data is attached to the header, the data attached bit is reset. This is the case for all headers after formatting. Once data is written for the sector number, the data attached bit is set. The final piece of information included in the attribute word is a revision number. The revision number allows solid state controller 64 to identify the valid header when multiple valid headers with the same LSN exist.

The last piece of information stored in header 85 is a block sector offset (BSO). The BSO is an offset from the top of the block to the start of FLASH memory space associated with the header. Memory space is allocated to a header whether or not data is stored in that space. If data is not attached to the header, then the amount of memory allocated is the size of data space 86 divided by the maximum number of headers in BSTT 84.

Memory space must be allocated to headers that do not have sector data attached. This is because during formatting entire BSTTs 84 are filled with headers that have no data attached. Even though all of data space 86 associated with these BSTTs 84 is free, data space 86 cannot be written to. There is simply no room in the BSTTs of these blocks. To avoid a Catch 22 situation in which free memory is not available for allocation, all of data space 86 associated with these BSTTs 84 is categorized as user data. In other words, the sector is neither dirty, as indicated by dirty bits, nor free. By allocating memory data space 86 to headers with unattached data and by subtracting that amount of memory from the amount of free memory in the appropriate block, appropriate chip, and array, part of data space 86 is designated as user data. As sectors of data are written after formatting, the headers without attached data will be marked dirty, along with their allocated data space. Eventually, blocks filled up during formatting will be cleaned-up and their data space made available as free memory.

It is crucial that headers can be written without data attached when data compression is not used. Few reserves are available for clean-up when data compression is not used and every possible sector of data is written to solid state disk 60. In this situation, clean-up efficiency is seriously impaired, and data fragmentation is likely. Data fragmentation, in turn, leads to many foreground clean-ups, degrading overall solid state disk performance.

Because data for one sector is butted up against data for another sector in data space 86, each BSO indicates the top of data for one sector and the bottom of data for another sector. For example, the block offset for sector 1, $BSO_1$, points to the start of the data associated with $LSN_1$. $BSO_1$ also points to the bottom of data associated with $LSN_2$. Another way of looking at block sector translation table 84 is that each LSN is sandwiched between two block sector offsets, one pointing to the top of the sector data and the other pointing to the bottom of the sector data. The bottom of the data associated with the sector stored at the bottom of the block, $LSN_1$, need not be indicated by a BSO as the location of the bottom of the block is known.

Block sector translation table 84 grows down toward data space 86. The first header BSTT 84 is written at the top of block 80. The header for each succeeding sector written into block 80 is stored below the previous header.

In contrast to BSTT 84, data space 86 grows upward. The first sector of data written into block 80 is written into the bottom of data space 86. The next sector of data written into data space 86 is written immediately above the previous sector. For example, the data associated with $LSN_2$ is located within a lower range of addresses than the data associated with $LSN_1$.

The number of sectors that may be stored in data space 86 before it runs into BSTT 84 varies. This variability arises when sector data is compressed, which causes sector size to vary. With data compression, sector size may vary between 256 words to just a few words. A maximum of 2047 sectors may be stored in data space 86 given the seek strategy used by solid state disk 60.

Solid state disk controller 64 prevents BSTT 84 and data space 86 from crashing into each other as they grow. In fact, solid state disk controller 64 ensures that some slack 88 is maintained between BSTT 84 and data space 86. Slack 88 is free FLASH memory, which has not been programmed. According to the conventions of FLASH memory, a free memory location stores FFFF (hexadecimal). During seeks of block sector translation table 84, slack 88 indicates that the end of BSTT 84 has been reached.

Block 80 also stores block attribute data 90. Information specific to the block is stored attribute data 90. For example, block attribute data 90 includes cycle count, which indicates the number of times the block has been erased and written to. Block attribute data 90 may also include block defect information.

B. Overview of the Solid State Controller Hardware

Referring once again to FIG. 2, reading, writing, and clean-up of FLASH array 62 is controlled by solid state disk controller 64. Microprocessor 92 manages these tasks using database 93, sector header translation table (SHTT) 94 and the algorithms of the present invention, which are stored in FLASH memory 95. Databases 93, SHTT 94, and algorithms will be described in greater detail below. An application specific integrated circuit, window ASIC 96, serves as a window to the outside world for microprocessor 92 as well as windows into the FLASH array 62. Via window ASIC 96, microprocessor 92 receives commands from CPU 52 and reads and writes to FLASH array 62. Window ASIC 96 includes four windows, allowing microprocessor 92 to repeatedly and rapidly access a number of FLASH memory locations. Data to and from CPU 52 flows through window ASIC 96 to sector buffer 98. Sector buffer 98 allows data transfers to CPU 52 to occur more rapidly that possible otherwise. Solid state disk controller 64 includes charge pump 100. Charge pump 100 converts 5 volts into the 12-volt level needed for programming and erasure. Charge pump 100 is not necessary unless the voltage levels supplied to solid state disk 60 are all below the 12-volt voltage level necessary to program the FLASH devices within FLASH array 62.

C. FLASH Array Database and Sector Header Translation Table

Performance of solid state disk 60 is enhanced by storing repeatedly used information in random access memory (RAM). This information is referred to as FLASH array database 93 because it generally relates to current characteristics of FLASH array 62. Information within FLASH array database 93 includes:

1. The total number of dirty words within FLASH array 62 (TDFA);
2. The total number of dirty words in each block (TDFB$_N$);
3. The total number of free words within FLASH array 62 (TFFA);
4. The number of free words within each chip pair (TFFC$_M$); and
5. The total number of free words within each block (TFFB$_N$).

The use of FLASH array database 93 by solid state disk controller 64 will be described below on an algorithm by algorithm basis.

Sector header translation table (SHTT) 94 translates a sector number into a pointer to an associated sector of data. To permit its frequent and easy modification, SHTT 94 is preferably stored in RAM. The pointer supplied by sector header translation table 94 does not point directly to the data associated with the given sector number. Rather, the pointer supplied by SHTT 94 points to a location within BSTT 84 near the header associated with the sector number.

The reason why SHTT 94 does not point directly to the header associated with the sector number can be understood by examining the number of bits necessary to uniquely address each possible header in a BSTT 84. A maximum of 2047 headers may be stored in a BSTT 84. Given 15 chip pairs, each including 16 blocks in a chip pair, FLASH array 62 could store as many as 491,280 headers. Uniquely identifying that many headers requires 19 bits. Storing 19 bits requires using three by 8 RAM chips. Thus, 5 of 8 bits in one RAM would be wasted to store three bits. This is an expensive and unacceptable solution in the effort to produce a price competitive solid state memory disk.

A number of SHTT designs solve this 19 bit dilemma. One embodiment, shown in FIG. 4, stores a pointer for every one of the possible 83,300 sectors numbers of data of an industry standard 40 MB disk drive. Only 16 bits are stored for each entry in SHTT 94. Four of the bits indicate the chip pair in which the sector data being sought is stored. Another four bits indicate the particular block in which the sector is stored. The remaining 8 bits represent an offset from the top of the block to header which is near the desired header. This offset is called a header pointer. Using 8 bits to represent the header pointer means that there are 256 header pointers available to locate a maximum of 2047 headers. Consequently, a maximum of 8 headers must be scanned in BSTT 84 to locate the desired header. Stated another way, SHTT 94 requires a two tiered search to locate the data associated with a particular sector number. First, SHTT 94 is searched to locate a particular chip, block and header pointer. Second, the indicated area of BSTT 84 is searched to find the header associated with the sector number.

SHTT 94 of FIG. 4 stores a physical address for each sector stored on solid state disk 60. The number of entries in SHTT 94 can be reduced by using a most recently used cache memory.

Both FLASH array database 93 and SHTT 94 must be generated during power-up because they are stored in volatile memory, RAM, and because reads and writes depend upon these 93 and 94. FIG. 5 illustrates an algorithm to build both FLASH array database 93 and SHTT 94. Using this algorithm both SHTT 94 and the FLASH array database 93 are generated by scanning each BSTT 84. The location of the header associated with each sector number is noted, as well as the amount of free and dirty memory within the block.

Building begins in step 110 with the initialization of SHTT 94. Each pointer for each sector number is set to the same initial value. In one embodiment, that value is FFFF (hexadecimal). As a result, after building SHTT 94 retrieving a pointer equal to the initial value indicates that the sector of data associated with the sector number has been lost because during formatting a header is created for each sector number. Microprocessor 92 branches from step 110 to step 111.

In step 111 total amount of free memory within FLASH array, TFFA, and the total amount of free memory per chip, TFFC$_M$, are initialized to their maximum values. The maximum free FLASH per chip is 64 Kbyte/block * 16 blocks, or 2048 Kbyte per chip pair minus the block attribute data stored in each block. Similarly, TFFA$_{max}$ is 2048 Kbyte per chip pair * 15 chip pairs, or approximately 30 Mbyte. This done, microprocessor 92 branches to step 112 to begin scanning BSTTs 84.

In step 112 microprocessor 92 determines whether any block within FLASH array 62 remains to be scanned. If so, microprocessor 92 proceeds to step 114 and selects a block to scan, B$_C$. From step 114, microprocessor 92 branches to step 115. There the total amount of free memory in the current block, TFFB$_C$, is initialized to its maximum. Microprocessor 92 then proceeds to step 116.

In step 116, microprocessor 92 reads the next header from the selected block's block sector translation table 84. Afterward, microprocessor 92 branches to step 118.

Microprocessor 92 begins to classify the current header in step 118. Microprocessor 92 determines whether the header has been marked dirty by reading the dirty bits included in the attribute word of the current header. If either dirty bit is a logical zero, the data associated with the LSN is considered dirty. If the sector of data is dirty microprocessor 92 branches to step 120 to update FLASH array database 93.

In step 120, microprocessor 92 determines the size of the dirty sector, which may vary as a result of data compression. Sector size is determined by comparing the block sector offsets on either side of the current LSN. After determining the size of the dirty sector, microprocessor 92 updates TDFA and TDFB$_C$. The total number of dirty words, TDFA, and the total number of dirty words within the current block, TDFB$_C$, are increased by the size of the sector and its header. Afterward, microprocessor 92 advances to step 121.

Microprocessor 92 appropriately revises its FLASH free variables. The size of the current sector and its header are subtracted from TFFA, TFFB$_C$ and TFFC$_C$. Afterward, microprocessor returns to the building of FLASH array database 93 and SHTT 94 by branching back to step 116.

On the other hand, if the sector is not dirty microprocessor 92 branches from step 118 to step 122. Microprocessor 92 then examines the attribute word within the current header to determine if the end of the BSTT 84 has been reached. If the attribute word for the next header is FFFF (hexadecimal), the end has been reached. In this case, microprocessor 92 branches back to step 112 to determine whether scanning of BSTTs 84 should continue. In all other cases, microprocessor 92 advances to step 124 from step 122.

Entry into step 124 means that the current header is associated with a valid sector of user data. Accordingly, microprocessor 92 reduces free variables TFFA, $TFFB_C$ and $TFFC_C$ by the size of the current sector. (The subscript "C" designates "current.") This done, microprocessor 92 advances to step 126.

In step 126, revision of the SHTT entry for the current header begins by seeking an entry in SHTT 94 for the sector number equal to the LSN included in the current header. If the current entry in the SHTT is FFFF (hexadecimal), no information exists for the sector number. Microprocessor 92 responds to this situation by branching to step 128. Any entry other than FFFF for the sector number means that there are two valid versions of the data for that sector number. To sort things out, microprocessor 92 advances to step 130.

Consider first the simpler situation; that is, when no data is stored in SHTT 94 for the sector number corresponding to the current LSN. In step 128, microprocessor 92 writes the chip, block and header pointer for the current header into SHTT 94. This done, microprocessor 92 branches back to step 116 to examine another header.

Things are more complicated when SHTT 94 already includes an entry for the sector number associated with the current LSN. In step 130, the microprocessor determines which header and thus which sector of data is most current by comparing their revision numbers. In step 132, microprocessor 92 then marks dirty the earlier, invalid, sector of data by programming the dirty bits in its header to a logical 0.

In step 133, the microprocessor updates database 93 to reflect the total dirty for the block including the sector just marked dirty and for FLASH array 62. The update is accomplished by adding the sector size to $TDFB_C$ and TDFA.

SHTT 94 is finally updated, if necessary, in step 134. No update is necessary if the header and LSN selected in step 116 were marked dirty in step 132. Otherwise, the chip, block and header pointer for the LSN selected in step 116 are written into SHTT 94.

From step 134, microprocessor 92 returns to step 116. There another header is selected.

After every header within FLASH array 62 has been scanned, building of SHTT 94 is complete. If a header has not been located which corresponds to a sector number, the pointer within SHTT 94 remains at its initial value. Thus, the pointer indicates that the sector of data has been lost and every sector of data is accounted for by SHTT 94.

II. Solid State Disk Controller

The heart of solid state disk controller 64 is the set of algorithms stored within FLASH memory 95. These algorithms control the reading, writing, and cleaning-up of FLASH array 62. These algorithms help create the illusion that CPU 52 is dealing with an industry-standard hard magnetic disk drive.

The object diagram of FIG. 6 illustrates the general organization and interrelationship of algorithms used by solid state controller 64. The algorithms of solid state disk controller 64 are organized into three classes: top level scheduler 150, host interface 152, and FLASH media 154. Top level scheduler 150 handles the allocation of CPU 92 processing time between the other two classes 152 and 154. Host interface 152 interprets industry standard disk drive commands from CPU 52 and translates them into commands that FLASH media 154 can act upon. FLASH media 154 interfaces directly with FLASH array 62, responding to read and write requests from host interface 152. FLASH media 154 also manages the cleaning-up of FLASH array 62.

The scheduling of host interface 152 and FLASH media 154 is a relatively simple task. Power-up of solid state disk 60 fires top level scheduler 150. It initializes the solid state disk 60 and then calls host interface 152. This allocates to CPU 52 all the resources of solid state disk 60. When host interface 152 returns control to top level scheduler 150, clean-up object 164 is called. If a clean-up is on-going, then a slice of CPU execution time, $500\mu$ seconds in one embodiment, is allocated for clean-up. When clean-up returns control to top level scheduler 150, host interface 152 is called again. Top level scheduler 150 repeats the process again and again for as long as solid state disk 60 is powered up.

Host interface 152 includes two classes of algorithms, interface 156 and sector buffer 158. Interface 156 emulates an AT-IDE hard disk interface. Interface 156 handles ATA command interrupts and translates ATA commands into commands comprehensible by FLASH media 154. In alternate embodiments, host interface 156 may simulate a SCSI disk interface or other standard disk drive interface. Sector buffer 158 manages the usage of sector buffer 98.

Briefly described, FLASH media 154 includes five types of algorithms, or services: disk 160, sectors 162, clean-up 164, FLASH power 166 and FLASH array interface 167. Disk 160 services read and write requests from interface 156. Disk 160 also translates other commands from disk 160 and delegates them for execution to fellow classes 162, 164, 166 and 167. Sectors 162 is responsible for most tasks relating to sectors stored within FLASH array 62. Sectors 162 maintains FLASH array database 93 used by both disk 160 and clean-up 164, as well as allocating free memory space within FLASH array 62. Sectors 162 also controls the reading of data from FLASH array 62 via FLASH array interface 167 and sequencer 168. FLASH power 166 is essentially a device driver; that is, it generates the voltage levels necessary to read or write to FLASH array 62. FLASH array interface 167 handles the low level routines which directly control the reading and writing of FLASH array 62. Sequencer 168 handles the movement of data between sector buffer 98 and FLASH array 62. Just as its name implies, clean-up 164 manages the clean-up of FLASH array 62. FLASH power 166 manages the limited current budget of solid state disk 60, which in one embodiment is only 120 mA. Given that erasing a block in a chip pair requires up to 60 mA efficient management of current is a concern.

A. Reading a Sector from FLASH Array 62

Briefly described, reading a sector is a three step process. First, SHTT 94 is searched for a pointer to the header associated with the sector number. Second, the header is located and its attribute word is examined to see if the attached data is valid. Third, if the sector data associated with header is valid, its location is determined and returned to CPU 52.

A read algorithm implemented by disk 160 is illustrated in the flow diagram of FIG. 7. All callers input a sector number.

The first task of microprocessor 92 in step 170 is examination of the input sector number for validity. The maximum number of sectors within an industry standard disk drive determines whether a sector number is valid. For example, a standard 40 MB drive includes 83,300 sectors. Thus, any sector number greater than 83,300 would be invalid in a 40 MB drive.

Microprocessor 92 branches from step 170 to step 172 if the calling program passed in an invalid sector number. Microprocessor 92 indicates the invalidity of the sector number to the caller by setting a status word to invalid sector number range. Microprocessor 92 then branches to step 174, returning control to the caller.

On the other hand, microprocessor 92 proceeds to step 176 from step 170 if the caller has requested to read a sector with a valid sector number. In step 176, microprocessor 92 takes the sector number and searches SHTT 94 for the chip, block and header pointer associated with the sector number.

Microprocessor 92 determines in step 178 whether data exists for the sector number requested. Microprocessor 92 may be able to tell whether a header exists for a particular sector number by examining the header pointer retrieved from SHTT 94. If the header pointer is FFFF (hexadecimal), a valid header cannot be found for the sector number, even though a header is created for every sector number during formatting.

Microprocessor 92 responds to a lost sector by branching to step 180 from step 178. There microprocessor 92 indicates that the header was not found. Microprocessor 92 then branches to step 174, the read complete.

On the other hand, if a header exists for the sector number then microprocessor 92 branches to step 182. There sectors 162 seeks for the header associated with the input sector number. If the desired header is located, sectors 162 indicates the chip, block, and offset to that header. Sectors 162 also indicates if the desired header cannot be found.

Once sectors 162 returns from its seek, microprocessor 92 branches to step 184 to determine the success of the seek. If the seek algorithm did not locate the header associated with the sector number, microprocessor 92 branches to step 180 to so inform the caller. On the other hand, if the appropriate header was located microprocessor 92 branches to step 186. There the information retrieved in step 182 is passed to the read service of sectors object 162. The data associated with the sector number will be copied into sector buffer 98 and provided to host CPU 52. Afterward, the read complete, microprocessor 92 returns control to the caller by branching to step 174.

FIG. 8 illustrates a method of seeking sector data given a sector number. This algorithm also is implemented by sectors 162.

Briefly described, the seek algorithm of FIG. 8 has two approaches to locate the data associated a sector number. The first approach relies upon data coherency to decrease seek time. That is, it is assumed that the sector of data being currently sought is related to, and located near, the last sector of data located. If this approach fails to locate the desired sector of data, then a two tiered approach is used. First, SHTT 94 is searched to located a chip, block and a header offset for the sector number input, $SN_i$. Then, using that information, a BSTT 84 is searched for a header with an LSN equal to the sector number input by the caller.

Location of the sector of data begins in step 190. There microprocessor 92 determines whether another header is stored in the last BSTT 84 searched. If so, it is possible that the header associated with input sector number resides within the same BSTT 84. In that case, microprocessor 92 advances to step 192. However, if the last header located was the last header located within its BSTT 84, then it is not possible to quickly locate the sector of data associated with the input sector number. A two tiered search must be used. Microprocessor 92 advances to step 206 in that case to begin that two tiered search.

Consider first, the actions of microprocessor 92 upon entry to step 192. Microprocessor 92 reads the header immediately following the last header located. Let us designate the LSN in this header "$LSN_{L+1}$." $LSN_{L+1}$ is compared to $SN_i$ in step 194 to determine if the current header is the desired header. If $LSN_{L+1}$ does not equal $SN_i$ then the sector of data must be located another way. In that case, microprocessor 92 advances to step 206. On the other hand if $LSN_{L+1}$ does equal $SN_i$ then microprocessor 92 branches to step 196.

With step 196 the process of determining the reliability of the current header begins. During step 196 microprocessor generates a cyclical redundancy check (CRC) for the current header. Let us call this CRC "$CRC_G$." In step 198 $CRC_G$ is compared to the CRC stored in the header itself, $CRC_{stored}$. The information within the current header is considered reliable when $CRC_G = CRC_{stored}$. Microprocessor 92 responds to this condition by branching to step 202. On the other hand, if the current header is not reliable because $CRC_G$ does not equal $CRC_{stored}$ then microprocessor 92 proceeds to step 206.

Consider first the actions of microprocessor 92 when the desired header has been located. Microprocessor 92 first determines the size of the sector of data associated with the header in step 200. This is done using the appropriate block sector offsets, as previously discussed. The sector size, chip, block and offset to the desired header are returned to the caller in step 202.

When it is successful, the method of steps 190–202 reduces the time required to locate a sector of data by a factor of four as compared to the two-tiered search of steps 206–222.

The two-tiered search begins with step 206 after the quicker approach has failed. Microprocessor 92 performs the first level of search by seeking SHTT 94 for the chip, block and header pointer associated with the sector number input $SN_i$. The values for the chip, block and header pointer retrieved in step 206 are examined in step 208 to determine whether a header can possibly be located for $SN_i$. If the values are equal to the initial value, then the header associated with $SN_i$ has been lost. In one embodiment the initial, invalid values are FFFF (hexadecimal). Microprocessor 92 responds to invalid chip, block and header pointer values by branching to step 224. There the caller is informed that he header associated with input sector number was not found. On the other hand, if the values retrieved from SHTT 94 are valid, microprocessor 92 advances to step 210.

The second tier of the seek begins in step 210 by initializing a scan count to zero. The scan count tracks the number of header examined during the seek. Microprocessor 92 then reads header near the header pointer.

From step 210, microprocessor 92 advance to step 212 to compare the current scan count to the maximum scan count.

The maximum number of headers that must be scanned is set by dividing the maximum number of headers in a BSTT 84 by the maximum number of header pointers. For example, in one embodiment of solid state disk 60, a maximum of 2047 headers are stored in BSTT 84 and only 256 header pointers are used. Thus, a maximum of 8 headers must be scanned in this embodiment. If the scan count is less than the maximum, microprocessor 92 branches to step 214 to continue the search for the desired header. On the other hand, once the scan count exceeds the maximum microprocessor 92 advances to step 224 from 200.

Consider first the situation when the scan count is less than the maximum. Microprocessor 92 enters step 214 where it compares the LSN stored in the current header to the input sector number. If the two are equal the desired header may have been located. Otherwise, the search for the desired sector must continue.

The search of the desired sector continues in step 222 by incrementing the scan counter and reading another header located beneath the last header. Microprocessor 92 then returns to step 21 2 to determine whether this new header is the desired header.

When an LSN is equal to the input sector number, microprocessor 92 advances to step 216 from step 214. In step 216 a cyclical redundancy check, $CRC_G$, is generated for the current header. $CRC_G$ is used in step 218 to assess the reliability of the information included in the header.

There microprocessor 92 determines whether the current header is the one sought by comparing the sector number input, $SN_i$, to the LSN stored in the block. If $LSN=SN_i$, microprocessor 92 advances to step 216.

In step 218 reliability of the header is determined by comparing $CRC_G$ to the CRC stored in the selected header. The information within the header cannot be relied upon unless the two CRCs are equal.

Microprocessor 92 branches to step 220 from step 218 if the current header is not reliable. Because the block sector offset within the current header cannot be relied upon, two sectors of data are lost. For example, assume that the header being scanned was the header for LSN1, illustrated in FIG. 3. Because $BSO_1$ cannot be relied upon, neither the start of data for $LSN_1$, nor the end of data for $LSN_2$ can be determined. Thus, in step 220 microprocessor 92 discards two sectors of data by marking dirty both the selected header and the header immediately beneath it. Microprocessor 92 then advances to step 222.

If the current header can be relied upon, microprocessor 92 advances to step 200 from 218. Having reached step 200, microprocessor 92 begins gathering the information needed to read the sector data. First, the size of the sector is determined by reading the appropriate BSOs. Finally, in step 202 the sector size and attribute word is returned to the caller along with the chip, block and offset to the header. Microprocessor 92 then returns control to the caller in step 204.

Choosing a focus block begins in step 440 by determining whether all blocks have been examined, and thus, whether a focus block has been selected. Microprocessor 92 does this by determining whether all chip pairs have been searched. The first pass through step 440, microprocessor 92 branches to step 442 because not a single chip pair has been examined.

In step 444 microprocessor 92 selects a block to examine within the selected chip pair. Microprocessor 92 then advances to step 448 if every block has not been examined yet.

In step 445, microprocessor 92 determines whether the block is part of a chip pair that is currently the focus of clean-up by another clean-up state machine. This makes the current block a less desirable focus block because all blocks within a chip targeted for clean-up will be unavailable at some point for a long period of time. Microprocessor 92 is able to determine whether a chip is targeted for clean-up by another clean-up state machine by examining the chip and block information stored in RAM. After multiplying this factor by weight 1 to generate Rule 1, microprocessor 92 then advances to step 446. The first score is generated by multiplying the total number of dirty words within the current block $TDFB_C$, by a first weight. The value of this weight should be substantially larger than the value of subsequent weights. Microprocessor 92 then branches to step 448 from step 446.

Microprocessor 92 calculates a second score for the current block in step 448. There the total amount of free FLASH within the selected chip pair $TFFC_C$ is multiplied by a second weight. Afterward, microprocessor 92 branches to step 449.

A third score is calculated in step 449. The desirability of a block is evaluated there in terms of whether the current block resides within the chip pair last erased. Afterward, microprocessor 92 advances to step 450.

In step 450 microprocessor 92 calculates a fourth score for the current block. Microprocessor 92 begins calculating this score by subtracting the total number of good bytes in the current block from the total number of bytes within that block. Microprocessor 92 then multiplies this number by a fourth weight. The fourth weight is meant to bias slightly the selection of a focus block towards choosing a block with less good sector data. Thus, microprocessor 92 then branches to step 451. The fourth weight is relatively small compared to the first weight.

The fifth and final score for the current block is generated during step 451. The fifth factor considered skews selection toward blocks with lower cycle counts, thus, performing passive wear leveling. The fewer cycle counts of the current block compared to the maximum cycle count within array 62, the more desirable the block is. This factor, represented by "$\Delta$ cycle count" is then multiplied by the fifth weight.

In step 452 microprocessor 92 generates a total score for the block by adding together Rules 1, 4, and 5, which reflect desirable characteristics of the current block. From this sum Rules 0, 2, and 3 are subtracted because they indicate undesirable characteristics of a focus block.

Advancing to step 454, microprocessor 92 then compares the total score for the current block to the greatest total score. If the total score for the current block exceeds the greatest total score, then the greatest total score is revised upward and microprocessor 92 advances to step to 456. On the other hand, microprocessor 92 branches back up to step 444 if the total score for the current block is not greater than the greatest total score.

In step 456 microprocessor 92 stores the chip, and block and score of the block with the current greatest total score. Microprocessor 92 then returns to step 444.

Upon reentry to step 444 microprocessor decides whether every block within the currently selected chip pair has been evaluated. If not, microprocessor 92 branches through steps 446,448, 450, 452, 454, 456, and 444 until every block within the selected chip pair has been evaluated. Microprocessor 92 branches back to step 440 once every block within the selected chip pair has been evaluated.

Step 440 determines whether the blocks within every chip pair have been examined. If not, microprocessor 92 branches through steps 442, 444, 446, 448, 450, 452, 454, 456, and 440 until all blocks in all chip pairs within FLASH array 62 have been evaluated. Microprocessor 92 then proceeds to step 458.

Microprocessor 92 writes the chip and block selected as the focus of clean-up into the focus window. Microprocessor 92 uses the block and chip address stored in step 456 to do this. Afterward, microprocessor proceeds to step 460.

Having reached its current goal, in step 460 microprocessor 92 sets the CSM next state pointer to allocate free physical sector, state 384.

From step 460 microprocessor 92 returns control to top level scheduler 150 by branching to step 462.

5. Allocating Free Physical Sectors for Clean-up

Prior to erasing the focus block, all valid sectors of user data must be copied from the focus block and relocated into destination blocks. The first step in the relocation process is allocating memory space for the sectors of the user data currently residing in the focus block. FIG. 21 illustrates an algorithm for state 384, which manages the allocation of memory during clean-up.

Microprocessor 92 begins allocation in step 472 by determining whether every good sector within the focus block has been relocated. Microprocessor 92 makes its decision by scanning down BSTT 84 of the focus block until reaching the next header. Every sector of user data has been copied out of the focus block if the attribute word in the header is FFFF (hexadecimal). In that case, microprocessor 92 branches to state 480. If every valid sector has not been copied out, microprocessor 92 examines the attribute word to see if the sector is valid or dirty. Dirty sectors cause microprocessor 92 to scan down BSTT 84 to the next header. Microprocessor 92 responds to good sectors by determining the sector size and advancing to step 474.

In step 474 microprocessor 92 allocates memory for the sector identified in step 472 by calling the allocate algorithm of FIG. 10 or an alternate algorithm to be discussed later. Afterward, microprocessor 92 advances to step 476.

Microprocessor 92 prepares to exit state 384 in step 476 by resetting the CSM next state pointer to state 385. Thus, when background clean-up resumes execution, copying of the sector from the focus block into sector buffer 98 will begin. This done, microprocessor 92 returns control to top level scheduler 150 by branching to step 478.

Microprocessor 92 returns again and again to state 476 until every valid sector has been copied out of the focus block. Once that occurs, microprocessor 92 branches to step 480 from step 472. In step 480 microprocessor 92 initiates focus block erasure by appropriately setting the CSM next state pointer to start erase. Control is returned to the calling program.

6. Allocating Free Physical Memory for Clean-up

FIG. 22 illustrates in flow diagram form an alternate method of allocating free physical memory for clean-up. A block selected as a destination block for clean-up must be both appropriate and desirable. The appropriateness of a block is assessed in essentially the same manner discussed previously with respect to the allocation methods illustrated in FIGS. 10 and 12. However, the assessment and definition of a desirable destination block differs. The most desirable destination block is the block that most closely fits the sectors of user data to be copied out of focus block. Defining the desirability of a destination block in this manner increases the coherency of user data by preserving large amounts of free data for host writes.

Allocation of memory during clean-up begins with initialization of variables used in the selection of the destination block. In steps 2202 and 2204 Best Fit Block and Best Fit Chip are both set to 0.

In step 2206 microprocessor 92 calculates the amount of free memory necessary to store the remaining sectors of user data within the focus block. Thus, even though memory for only one sector is allocated at a time, desirability is evaluated in terms of a block capable of storing all the remaining sectors of user data within the focus block. (As used herein, "sectors of user data" and "user data" is defined as memory that is neither free, nor dirty.)

In step 2207 microprocessor 92 initializes one more variable prior to beginning its evaluation of possible destination blocks. Score is initialized to a maximum value representative of the maximum amount of free memory in any block. Score is revised during evaluation to indicate the score of the most desirable destination block; that is the block whose available free memory is closest to the total free memory needed. This done, microprocessor 92 advances to step 2208.

The appropriateness of each block as a destination block is evaluated in steps 2208–2216 in the same manner discussed with respect to FIG. 12. Therefore, these steps are not discussed in detail.

Eventually an appropriate block will be identified and microprocessor 92 will reach step 221 6. There the desirability of the current block as a destination block will be determined. One factor defines destination block desirability according to the service of FIG. 22. How closely does the amount of free memory in the current match the amount of free memory needed to store all sectors of user data remaining within the focus block? A variable, Total, measures the desirability of the current block in terms of the free memory remaining after storing the user data within the focus block. Total may be a positive number or a negative number, depending upon whether the free memory in the current block is to great or too little. Microprocessor 92 then branches to step 2216.

In step 2216 microprocessor 92 determines whether the current block is a better fit than the block currently selected as the best fit. In other words, the absolute value of $Total_{CurrentBlock}$ is compared to the absolute value of Score. Using absolute values in the comparison ensures that blocks that are too small are considered as well as blocks that have more free memory than is strictly necessary. Microprocessor 92 returns to step 2208 to evaluate another block if the absolute value of $Total_{CurrentBlock}$ is not less than the absolute value of Score. On the other hand, if the current block is a better fit than a previous block then microprocessor 92 branches to step 2220 to revise best fit values.

Score is reset to $Total_{CurrentBlock}$ in step 2222. Afterward, in steps 2224 and 2226 Best Fit Chip and Best it Block are revised so that they point to the current block. This done, microprocessor 92 returns to step 2208 to evaluate another block.

After evaluating each block within FLASH array 62 microprocessor 92 exits from step 2208 to step 2228. Microprocessor 92 then determines whether there is sufficient memory in Best Fit Block to store the sector of data currently being moved out of the focus block. If not, microprocessor 92 idles the current clean-up machine in step 2230. Otherwise, microprocessor 92 advances to step 2232 to begin the process of actually reserving memory in the Best Fit Block, which it does in the same fashion as discussed previously with respect to FIGS. 10 and 12.

7. Copying Good Sectors

Copying a sector from the focus block into a destination block is a two step process. The selected sector of valid user data is first copied from the focus block into sector buffer 98. Secondly, the valid sector is copied from sector buffer 98 into the destination block. This two step process is not necessary, but it improves the reliability of user data by taking advantage of the error detection capabilities of an error detection circuit that is in the path of sequencer 168.

The algorithm of FIG. 22 handles the copying of a sector of user data from the focus block to sector buffer 98. First, in step 480, the sector is moved into sector buffer 98. Second, in step 482, microprocessor 92 sets the next state pointer to copy part of sector. Control is then returned to the caller in step 484.

Copying a sector from its temporary refuge in sector buffer 98 into the destination block is the responsibility of state 386, called Copy Part of Sector. Only part of the sector is copied each time state 386 is executed to ensure that its execution time is less than a selected maximum execution time. In one embodiment the maximum execution time of each state is limited to 500μ seconds FIG. 24 illustrates an algorithm for copying part of a sector from sector buffer 98. Microprocessor 92 begins in step 490 by deciding if the rest of the sector can be copied into the destination block within the maximum execution time. In one embodiment, microprocessor 92 does this by comparing to 20 the number of bytes remaining to be copied from sector buffer 98. The maximum number of words that can be copied will vary depending upon the selected maximum execution time. Microprocessor 92 branches to step 492 if it cannot copy the remainder of the sector within the maximum execution time.

In step 492 microprocessor 92 copies 20 bytes from sector buffer 98 to the destination block indicated by the clean-up state machine's destination window. Afterward, microprocessor 92 branches to step 494.

IV. Summary

Thus, a method of detecting the loss of a sector of data stored in a solid state memory disk has been described. In order to detect the loss of any sector of data a header is created for each sector number during formatting. Location and loss of a sector of data associated with a particular sector number is aided by a sector header translation table, which stores a pointer to the header currently associated with each sector number. Retrieving an invalid offset from the sector header translation table indicates that the sector of data associated with the sector number is lost. A sector of data can be lost even if the sector header translation table includes a valid offset. In this case, the loss may be detected in other ways.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method of detecting the loss of a sector of data stored in a solid state memory disk including a nonvolatile semiconductor memory, the sector of data being associated with a sector number, the method comprising the steps of:
    a) storing in the nonvolatile semiconductor memory a header for the sector number, the header including an offset to a first physical address for the sector of data;
    b) after power-up initializing a pointer to an initial value and storing the pointer in a sector header translation table stored in a volatile semiconductor memory;
    c) scanning the nonvolatile semiconductor memory to determine a second value for the pointer such that the pointer points to a physical address for the header;
    d) writing the second value for the pointer into the sector header translation table if the second value is determined;
    e) scanning the sector header translation table for the pointer in response to a command to locate the sector of data associated with the sector number; and
    f) determining that the sector of data associated with the sector number is lost if the pointer is equal to the initial value.

2. The method of claim 1 wherein the nonvolatile semiconductor memory is a FLASH EEPROM.

3. The method of claim 1 wherein the header includes a data attached bit, the data attached bit initially being set to a first state indicating that no data is attached to the header, and wherein the data attached bit is set to a second state indicating that data is attached to header when data is written for the sector number associated with the header.

4. A method of detecting the loss of a sector of data stored in a solid state memory disk including a nonvolatile semiconductor memory device, the sector of data being associated with a sector number, the method comprising the steps of:
    a) storing in the nonvolatile semiconductor memory a header for the sector number, the header including an offset to a first physical address for the sector of data and a logical sector number equal to the sector number;
    b) after power-up initializing a pointer to an initial value and storing the pointer in a sector header translation table stored in a volatile semiconductor memory;
    c) scanning the nonvolatile semiconductor memory to determine a second value for the pointer such that the pointer points to a physical address for the header;
    d) writing the second value for the pointer into the sector header translation table if the second value is determined;
    e) scanning the sector header translation table for the pointer in response to a command to locate the sector of data associated with the sector number;
    f) locating the header using the pointer; and
    g) indicating that the sector of data associated with the sector number is lost if the logical sector number in the header does not equal to the sector number.

5. The method of claim 4 further comprising the steps of:
   a) storing a cyclical redundancy check $CRC_H$ for the header in the header; and
   b) generating a cyclical redundancy check $CRC_G$ after the step of locating the header using the pointer;
   c) indicating that the sector of data associated with the sector number is lost if $CRC_G$ does not equal $CRC_H$.

6. The method of claim 4 wherein the nonvolatile semiconductor memory is a FLASH EEPROM.

7. The method of claim 4 wherein the header includes a data attached bit, the data attached bit initially being set to a first state indicating that no data is attached to the header, and wherein the data attached bit is set to a second state indicating that data is attached to header when data is written for the sector number associated with the header.

8. A method of detecting the loss of a sector of data stored in a solid state memory disk including a nonvolatile semiconductor memory device, the sector of data being associated with a sector number, the method comprising the steps of:
   a) storing in the nonvolatile semiconductor memory a header for the sector number, the header including an offset to a first physical address for the sector of data and a logical sector number equal to the sector number;
   b) after power-up initializing a pointer to an initial value and storing the pointer in a sector header translation table stored in a volatile semiconductor memory;
   c) scanning the nonvolatile semiconductor memory to determine a second value for the pointer such that the pointer points to a physical address for the header;
   d) writing the second value for the pointer into the sector header translation table if the second value is determined;
   e) scanning the sector header translation table for the pointer in response to a command to locate the sector of data associated with the sector number;
   f) indicating that the sector of data associated with the sector number is lost if the pointer is equal to the initial value;
   g) locating the header using the pointer if the pointer is not equal to the initial value; and
   h) indicating that the sector of data associated with the sector number is lost if the logical sector number included in the header does not equal the sector number.

9. The method of claim 8 further comprising the steps of:
   a) storing a cyclical redundancy check $CRC_H$ for the header in the header; and
   b) generating a cyclical redundancy check $CRC_G$ after the step of locating the header using the pointer;
   c) indicating that the sector of data associated with the sector number is lost if $CRC_G$ does not equal $CRC_H$.

10. The method of claim 8 wherein the nonvolatile semiconductor memory is a FLASH EEPROM.

11. The method of claim 8 wherein the header includes a data attached bit, the data attached bit initially being set to a first state indicating that no data is attached to the header, and wherein the data attached bit is set to a second state indicating that data is attached to header when data is written for the sector number associated with the header.

12. A method of detecting the loss of sector data stored in a solid state memory disk including a nonvolatile semiconductor memory device, the solid state memory disk storing a multiplicity of sectors of data, each sector of data being associated with a sector number, the method comprising the steps of:
   a) storing in the nonvolatile semiconductor memory a header for each sector number, each header including a logical sector number and an offset to a physical address of a sector of data associated with the header;
   b) after power-up initializing a sector header translation table storing a pointer for each sector number, the pointer pointing to a physical address for the header including with the sector number, initialization setting each pointer to an initial value, the sector header translation table being stored in a volatile semiconductor memory;
   c) upon power-up, for each sector number:
      1) scanning the nonvolatile semiconductor memory to locate a header including a logical sector number equal to the sector number;
      2) determining a physical location of the header if the the logical sector number included in the header is equal to the sector number is located;
      3) storing a second value representative of the physical location of the header as the pointer for the sector number;
   d) scanning the sector header translation table for a first pointer in response to a command to locate a first sector of data associated with a first sector number;
   e) indicating that the first sector of data is lost if the first pointer is equal to the initial value;
   f) locating a first header using the first pointer if the first pointer is not equal to the initial value; and
   g) indicating that the first sector of data is lost if the first header does not include a first logical sector number equal to the first sector number.

13. The method of claim 12 further comprising the steps of:
   a) storing a cyclical redundancy check $CRC_H$ for each header in each header; and
   b) generating a cyclical redundancy check $CRC_G$ after the step of locating the first header; and
   c) indicating that the first sector of data is lost if $CRC_G$ does not equal $CRC_H$ stored in the first header.

14. The method of claim 12 wherein the nonvolatile semiconductor memory is a FLASH EEPROM.

15. The method of claim 12 wherein the header includes a data attached bit, the data attached bit initially being set to a first state indicating that no data is attached to the header, and wherein the data attached bit is set to a second state indicating that data is attached to header when data is written for the sector number associated with the header.

16. A method of detecting the loss of sector data stored in a solid state memory disk including a nonvolatile semiconductor memory device, the solid state memory disk storing a multiplicity of sectors of data, each sector of data being associated with a sector number, the method comprising the steps of:
   a) formatting the nonvolatile semiconductor memory by:

1) generating a header for each sector number, each header including a logical sector number equal to the sector number and a data attached bit, the data attached bit being set to a first state indicating that a sector of data is not attached to the header;

2) allocating a portion of memory within the nonvolatile semiconductor memory for each header, the portion of memory equal to an amount of memory within the nonvolatile semiconductor memory available to store sectors of data divided by a number of headers stored within the nonvolatile semiconductor memory;

3) storing the header for each sector number into the nonvolatile semiconductor memory;

b) after power-up:

1) initializing a sector header translation table by storing a pointer for each sector number, each pointer pointing to a physical address for a header including a logical sector number equal to the sector number, initialization setting each pointer to an initial value, the sector header translation table being stored in a volatile semiconductor memory;

2) for each sector number:

A) scanning the nonvolatile semiconductor memory to locate a header including a logical sector number equal to the sector number;

B) determining a physical location of the header including the logical sector number equal to the sector number;

C) changing the pointer for the sector number to a second value representative of the physical location of the header;

c) scanning the sector header translation table for a first pointer in response to a command to locate a first sector of data associated with a first sector number; and d) indicating that the first sector of data is lost if the first pointer is equal to the initial value.

17. The method of claim 16 further comprising the steps of:

e) locating a first header using the first pointer if the first pointer is not equal to the initial value; and f) indicating that the first sector of data is lost if a first logical sector number included in the first header does not equal the first sector number.

18. The method of claim 17 further comprising the steps of:

a) storing a cyclical redundancy check $CRC_H$ for each header in each header;

b) generating a cyclical redundancy check $CRC_G$ after the step of locating the first header; and c) indicating that the first sector of data is lost if $CRC_G$ does not equal $CRC_H$ stored in the first header.

19. A method of detecting the loss of sector data stored in a solid state memory disk including a nonvolatile semiconductor memory device, the nonvolatile semiconductor memory device organized as blocks of memory, the solid state memory disk storing a multiplicity of sectors of data, each sector of data being associated with a sector number, the method comprising the steps of:

a) formatting the nonvolatile semiconductor memory by:

1) generating a header for each sector number, each header including a logical sector number equal to the sector number and a data attached bit, the data attached bit being set to a first state indicating that a sector of data is not attached to the header;

2) allocating a portion of memory within the nonvolatile semiconductor memory for each header, the portion of memory equal to an amount of memory within the nonvolatile semiconductor memory available to store sectors of data divided by a number of headers stored within the nonvolatile semiconductor memory;

3) storing the header for each sector number into a block of the nonvolatile semiconductor memory, a first maximum number of headers being stored in each block;

b) after power-up initializing a sector header translation table by storing a pointer for each sector number, each pointer pointing to an offset from a top of the block storing the header including a logical sector number equal to the sector number, initialization setting each pointer to an initial value, the sector header translation table being stored in a volatile semiconductor memory;

c) for each sector number:

1) scanning the nonvolatile semiconductor memory to locate the header including a logical sector number equal to the sector number;

2) determining the offset of the header;

3) writing a pointer for the sector number into the sector header translation table;

d) scanning the sector header translation table for a first pointer in response to a command to locate a first sector of data associated with a first sector number;

e) indicating that the first sector of data is lost if the first pointer is equal to the initial value;

f) locating the first header using the first pointer if the first pointer is not equal to the initial value, locating the first header including the steps of:

1) selecting a selected header near the first pointer;

2) comparing a selected logical sector number stored in the selected header to the first sector number;

3) indicating a physical address of the selected header if the selected logical sector number equals the first sector number;

4) repeating steps 1) through 3) if the selected logical sector number does not equal the first sector number and if a second maximum number of headers has not been scanned; and 5) indicating that the first sector of data is lost if the second maximum number of headers has been scanned.

20. The method of claim 19 further comprising the steps of:

a) storing a cyclical redundancy check $CRC_H$ for each header in each header;

b) generating a cyclical redundancy check $CRC_G$ after the step of locating the first header; and c) indicating that the first sector of data is lost if $CRC_G$ does not equal $CRC_H$ stored in the first header.

21. The method of claim 19 wherein the formatting step further comprises:

a) decreasing a first number representative of an amount of free memory within the nonvolatile semiconductor memory by the the portion of memory allocated to each header; and b) determining whether to allow a second sector of data to be written into the nonvolatile semiconductor memory based upon a comparison of a size of the second sector of data and the first number.

22. The method of claim 19 wherein the nonvolatile semiconductor memory is a FLASH EEPROM.

23. Circuitry for reliably storing sectors of data, each sector of data being associated with a sector number, the circuitry comprising:
   a) a nonvolatile semiconductor memory device for storing the sectors of data;
   b) a controller for controlling the nonvolatile semiconductor memory device, the controller including:
      1) formatting means for formatting the nonvolatile semiconductor memory by generating a header for each sector number and by allocating a portion of memory within the nonvolatile semiconductor memory for each header, the portion of memory equal to an amount of memory within the nonvolatile semiconductor memory available to store sectors of data divided by a number of headers stored within the nonvolatile semiconductor memory, each header including a logical sector number equal to a sector number, an offset representative of a first physical location of the portion of memory allocated to the header, and a data attached bit, the data attached bit being set to a first state indicating that a sector of data is not attached to the header;
      2) read/write means for writing a first sector of data associated with a first sector number to the nonvolatile semiconductor device in response to a write command and reading the first sector of data from the nonvolatile semiconductor memory in response to a read command, the read/write means changing the data attached bit in a first header associated with the first sector number from the first state to a second state in response to the write command, the second state indicating that the first sector of data is attached to the first header;
      3) seeking means for locating the first header in response to a one of a read command and a write command for the first sector of data associated with the first sector number, the seeking means indicating that the first sector of data is lost if a pointer to the first header is equal to a first value, the seeking means indicating that the first sector of data is lost if the first header does not include a first logical sector number equal to the first sector number; and
   c) a sector translation table storing for each sector number a pointer to a physical address for the header including a logical sector number to the sector number.

* * * * *

UNITED STATES PATENT AND TRADEMARK OFFICE
CERTIFICATE OF CORRECTION

PATENT NO.    : 5,437,020
DATED         : July 25, 1995
INVENTOR(S)   : Wells et al.

It is certified that error appears in the above-identified patent and that said Letters Patent is hereby corrected as shown below:

Delete column 13, line 55, through column 17, line 47.

Signed and Sealed this

Fifth Day of November, 1996

Attest:

BRUCE LEHMAN

*Attesting Officer*     *Commissioner of Patents and Trademarks*